(12) United States Patent
Wu et al.

(10) Patent No.: US 9,726,143 B2
(45) Date of Patent: Aug. 8, 2017

(54) OCEAN WAVE ENERGY HARVESTING WITH A PIEZOELECTRIC COUPLED BUOY

(71) Applicant: University of Manitoba, Winnipeg (CA)

(72) Inventors: Nan Wu, Winnipeg (CA); Quan Wang, Winnipeg (CA); Xiangdong Xie, Winnipeg (CA)

(*) Notice: Subject to any disclaimer, the term of this patent is extended or adjusted under 35 U.S.C. 154(b) by 203 days.

(21) Appl. No.: 14/680,456

(22) Filed: Apr. 7, 2015

(65) Prior Publication Data

US 2015/0285212 A1 Oct. 8, 2015

Related U.S. Application Data

(60) Provisional application No. 61/976,187, filed on Apr. 7, 2014.

(51) Int. Cl.
*H01L 41/113* (2006.01)
*H02N 2/18* (2006.01)
*F03B 13/20* (2006.01)

(52) U.S. Cl.
CPC .......... *F03B 13/20* (2013.01); *H01L 41/1136* (2013.01); *H02N 2/18* (2013.01); *Y02E 10/38* (2013.01)

(58) Field of Classification Search
CPC .......... H01L 41/113; H02N 2/18; F03B 13/20
(Continued)

(56) References Cited

U.S. PATENT DOCUMENTS

| | | | | |
|---|---|---|---|---|
| 4,404,490 A | * | 9/1983 | Taylor | F03B 13/14 290/42 |
| 4,536,674 A | * | 8/1985 | Schmidt | F03D 5/00 310/330 |

(Continued)

OTHER PUBLICATIONS

R. Murray, J. Rastegar, Novel two-stage piezoelectric-based ocean wave energy harvesters for moored or unmoored buoys, Active and Passive Smart Structures and Integrated Systems Proc. of SPIE 7288 (2009) 1117-1129.

*Primary Examiner* — J. San Martin
(74) *Attorney, Agent, or Firm* — Kyle R. Satterthwaite; Ryan W. Dupuis; Ade & Company Inc.

(57) ABSTRACT

An expedient piezoelectric coupled buoy energy harvester from ocean waves is developed. The harvester is made of several piezoelectric coupled cantilevers attached to a floating buoy structure, which can be easily suspended in the intermediate and deep ocean for energy harvesting. In the buoy structure, a slender cylindrical floater is attached on a large sinker. The energy harvesting process is realized by converting the transverse ocean wave energy to the electrical energy via the piezoelectric patches mounted on the cantilevers fixed on the buoy. A smart design of the buoy structure is developed to increase the energy harvesting efficiency by investigation of the effects of the sizes of the floater and the sinker. A numerical model is presented to calculate the generated electric power from buoy energy harvester. The research findings show that up to 22 W electric power can be generated by the proposed expedient buoy harvester with the length of the piezoelectric cantilevers of 1 m and the total length of the buoy of 12 m. The technique proposed in this research can provide an expedient, feasible and stable energy supply from the floating buoy structure.

17 Claims, 6 Drawing Sheets

(58) Field of Classification Search
USPC .................................... 310/339; 290/53, 42
See application file for complete search history.

(56) References Cited

U.S. PATENT DOCUMENTS

| | | | | |
|---|---|---|---|---|
| 4,781,023 A * | 11/1988 | Gordon | .................. | F03B 13/20 290/42 |
| 5,548,177 A * | 8/1996 | Carroll | .................... | H02N 2/18 290/53 |
| 5,578,889 A * | 11/1996 | Epstein | .................. | F03B 13/14 290/53 |
| 5,955,790 A * | 9/1999 | North | .................... | F03B 13/148 290/42 |
| 7,808,158 B1 * | 10/2010 | Deeds | .................... | H02N 2/185 310/102 R |
| 8,525,390 B2 * | 9/2013 | Allaei | .................... | H02N 2/185 310/319 |
| 8,650,963 B2 * | 2/2014 | Barr | .................... | G01L 11/008 73/170.29 |
| 9,279,409 B2 * | 3/2016 | Jean | .................... | F03B 13/185 |
| 2003/0121255 A1 * | 7/2003 | Dick | .................... | B63B 35/44 60/398 |
| 2007/0257491 A1 * | 11/2007 | Kornbluh | .................... | F03B 13/1845 290/53 |
| 2009/0015103 A1 * | 1/2009 | Rastegar | .................... | F03B 13/20 310/328 |
| 2009/0212571 A1 * | 8/2009 | Atilano | .................... | F03B 13/186 290/53 |
| 2011/0031749 A1 * | 2/2011 | Sapir | .................... | F03B 13/20 290/50 |
| 2011/0048133 A1 * | 3/2011 | Lin | .................... | G01P 15/09 73/514.34 |
| 2011/0062713 A1 * | 3/2011 | Ardoise | .................... | F03B 13/1865 290/53 |
| 2012/0268083 A1 * | 10/2012 | Hughes | .................... | F03B 13/1885 322/2 R |
| 2013/0127168 A1 * | 5/2013 | Dragic | .................... | F03B 13/1855 290/53 |
| 2014/0117671 A1 * | 5/2014 | Gregory | .................... | F03B 13/16 290/53 |
| 2015/0082935 A1 * | 3/2015 | Cibert | .................... | B25J 9/0075 74/490.05 |
| 2016/0013737 A1 * | 1/2016 | Yanez Villarreal | .... | H02N 2/181 310/339 |
| 2016/0368006 A9 * | 12/2016 | Mills | .................... | B05B 5/025 |

\* cited by examiner

FIG. 1A
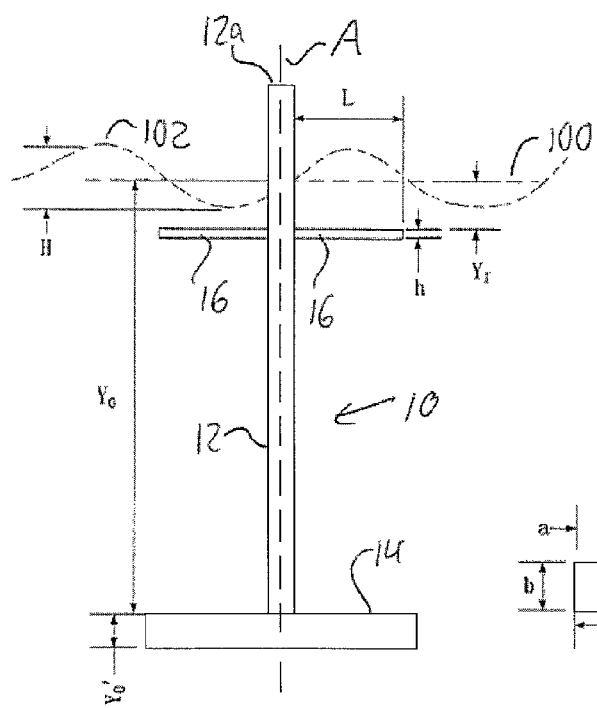
FIG. 1B
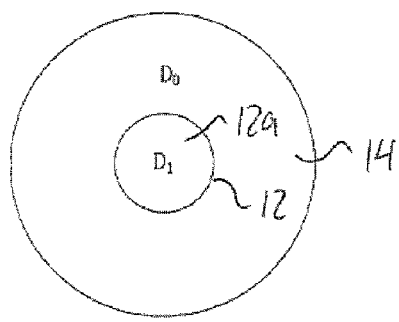
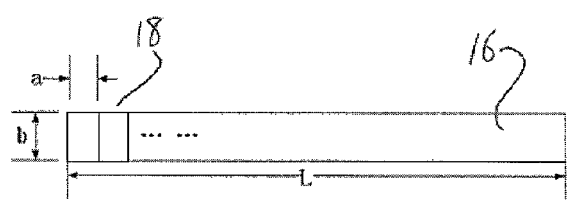
FIG. 1C

OCEAN WAVE ENERGY HARVESTING WITH A PIEZOELECTRIC COUPLED BUOY

CROSS REFERENCE TO RELATED APPLICATIONS

This application claims benefit under 35 U.S.C. 119(e) of Provisional Application Ser. No. 61/976,187, filed Apr. 7, 2014.

FIELD OF THE INVENTION

The present invention relates generally to harvesting electricity from ocean wave energy, and more specifically to devices and techniques for generating electricity from the relative displacement occurring between ocean waves and a free floating buoy in a transverse direction of the waves by using piezoelectric cantilevers that radiate externally from the buoy in exposed positions a short depth below the ocean surface in order to vibrate as a result of this relative transverse displacement.

BACKGROUND

In the past decade, with the development of low powered devices and appliances, such as the Light-emitting diode (LED), low cost wireless sensors and wireless access points, the self-power technique and the harvesting of energy from ambient vibration have attracted much attention from researchers [1-3]. Among the available mechanic-to-electric energy conversion mechanisms, such as electromagnetic, electrostatic and piezoelectric transductions, the energy density of the piezoelectric transduction is three times higher than electrostatic and electromagnetic transductions [4, 5]. Therefore, energy harvesting by piezoelectric materials has led to many different types of piezoelectric coupled structures for energy harvesting [6~11]. To further improve the energy harvesting efficiency, different designs of electric circuits and structure optimisation were presented by both numerical simulations and experimental studies. Liao and Sodano [12] studied a single mode energy harvester with different resistances to achieve a larger output electric power. Wang et al [13] proposed an optimal design of a collocated pair of piezoelectric patch actuators surface bonded onto beams. Wang and Wu [14] developed an optimal design of a piezoelectric patch mounted on a beam structure to achieve a higher power-harvesting efficiency through both numerical simulations and experimental studies. Xie et al [15] developed a design of a piezoelectric coupled cantilever structure attached by a mass subjected to base motion to achieve an effective energy harvesting.

In addition, it is noted that there is a huge reservation of sustainable and clear energy on the earth, such as wind and ocean energy. The flowing power of winds is usually from a typical intensity of 0.1~0.3 kW/m$^2$ to 0.5 kW/m$^2$ on the earth surface along the wind direction, while the flowing power of ocean waves is around 2~3 kW/m2 under the ocean surface along the direction of the wave propagation [16].

Therefore, based on the direct piezoelectric effect (the internal generation of electrical charge resulting from an applied mechanical force), the harvesting of renewable natural energies by piezoelectric materials has been initiated recently to pursue a clean and expedient self-contained energy source. Some research works have been conducted on development of new energy conversion technologies using piezoelectric materials to absorb wind energy, and also flowing water energy in ocean and rivers.

Ovejas and Cuadras [17] developed a wind energy harvester with thin piezoelectric films in a laminar wind tunnel and studied the electric power generation by experiments. Li et al [18] also proposed and tested a bio-inspired piezo-leaf architecture converting wind energy into electric energy by way of a wind-induced fluttering motion. An electric power output of 0.61 mW was generated by the harvester with the dimension of 72×16×0.41 mm. Gao et al. [19] reported a flow energy harvester based on a piezoelectric cantilever (PEC) with a cylindrical extension. This device utilizes flow-induced vibration of the cylindrical extension to directly drive the PEC to vibrate in order to harvest the energy from ambient flows such as wind or water streams. Wu and Wang [20] developed an energy harvester made of a cantilever attached by piezoelectric patches and a proof mass for wind energy harvesting from a cross wind-induced vibration of the cantilever by the electromechanical coupling effect of piezoelectric materials.

From the aforementioned research works, it is found that the harvested electric power from the wind energy is usually low due to the low energy density of the wind flows. In view of considerable large energy density from water flows and wave motions, for example ocean wave motions, which can easily exceed 50 kW per meter of wave front [21], harvesting energy from water flows and waves to generate electric energy by piezoelectric effects has long been pursued as an alternative or self-contained power source.

An energy harvester using a piezoelectric polymer 'eel' to convert the mechanical flow energy, available in oceans and rivers, to electric power was presented by Taylor et al [22]. Zurkinden et al. [23] designed a piezoelectric polymer wave energy harvester from wave motions at a characteristic wave frequency and investigated the influences on generated energy from the free surface wave, the fluid-structure-interaction, the mechanical energy input to the piezoelectric material, and the electric power output using an equivalent open circuit model. Xie et al. [24] developed a piezoelectric coupled plate structure, which is fixed on the sea bed, to harvest the horizontal ocean wave energy. Burns [25] provided a piezoelectric device consisted of a buoy floating on the ocean surface, a few anchor chains fixed on the ocean-bed and an array of piezoelectric micro thin films between the buoy and chains, and showed that the device can generate electric power when the piezoelectric films bear tension and compression alternatively duo to the up and down motion of the buoy. Murray and Rastegar [21] presented a novel class of two-stage electric energy generators on buoyant structures. These generators use the interaction between the buoy and sea wave as a low-speed input to a primary system, which, in turn, to successively excite an array of vibratory elements (secondary system) into resonance.

From previous studies, it was proven that energy harvesting from ocean waves by piezoelectric materials is effective and is able to generate sufficient electric power for small electric appliances [24]. However, most of piezoelectric energy harvesting structures in current studies are designed to be fixed on the sea bed, and hence are mostly applicable to shallow ocean and costly. It is obvious that the amount of the ocean wave energy in the intermediate and deep ocean with larger wave heights is much larger than the one in the shallow-water.

Therefore, an urgent need for a more efficient and economical energy harvesting from intermediate and deep oceans calls for challenging engineering designs. Disclosed herein is an expedient and economical floating buoyant energy harvester is developed for energy harvesting from the intermediate and deep ocean waves.

SUMMARY OF THE INVENTION

According to a first aspect of the invention, there is provided a wave energy harvester for generating electricity from transverse waves in a body of water, said wave energy harvester comprising a buoy that comprises a float and at least one cantilevered member attached to the float and radiating outwardly away from a longitudinal axis of said float in a position located externally of said float for exposure of said cantilevered member to surrounding water under placement of the buoy in said body of water, the at least one cantilevered member having piezoelectric material thereon arranged to generated electrical power under vibration of said at least one cantilevered member.

Preferably the buoy is free floating buoy.

Preferably the float has an elongated axial dimension measured along the longitudinal axis between upper and lower ends of the float, the upper end of the float defining an upper end of the buoy and the buoy having a center of mass located nearer to said lower end of the float than to said upper end of the float, and the at least one cantilevered member is spaced a distance from said upper end of the float along the longitudinal axis thereof in order to reside in a submerged position below a surface of the ocean.

Preferably the at least one cantilevered member is positioned between said center of mass and said upper end of the float.

Preferably the position of the at least one cantilevered member is nearer to the upper end of the float than the lower end thereof.

Preferably the buoy comprises a sinker portion that is attached to the lower end of the float and which, along the longitudinal axis, has a greater linear mass density than the float.

Preferably the sinker portion has a greater diameter across the longitudinal axis than the float.

Preferably the sinker portion has an axial length, measured along the longitudinal axis, which is less than the axial dimension of the float.

Preferably the float and the sinker comprises respective bodies of a same material.

Preferably the sinker is cylindrical.

Preferably the float is cylindrical.

Preferably the buoy comprises a hollow interior and at least one selectively openable and closeable opening by which a fill medium can be selectively introduced and removed to change an average density of the buoy.

Preferably the at least one cantilevered member comprises a plurality of cantilevered members evenly spaced apart around the longitudinal axis.

Preferably the plurality of cantilevered members are even in number and arranged in opposing pairs across the longitudinal axis.

According to a second aspect of the invention, there is provided a method of generating electricity from transverse waves in a body of water, the method comprising the steps of:

(a) placing an energy harvesting buoy in a floating position in said body of water in which at least one piezoelectric cantilever radiates outwardly away from an upright longitudinal axis of the energy harvesting buoy at a submerged position exposed to said body of water at a depth spaced beneath a surface of said body of water; and (b) leaving the energy harvesting buoy in said floating position and allowing passage of transverse surface waves over the submerged piezoelectric cantilever in a manner vibrating said piezoelectric cantilever and generating electrical power from same.

Preferably step (a) comprises placing the energy harvesting buoy in the body of water in a free-floating, unmoored, unanchored condition.

Preferably step (a) comprises placing the energy harvesting buoy in the body of water in a self-righting condition tending to maintain an upright orientation of the longitudinal axis of the energy harvesting buoy.

According to a third aspect of the invention, there is provided a method of generating electricity from transverse waves in a body of water, the method comprising using relative displacement between said transverse waves and an energy harvesting buoy floating in said body of water to cause electricity-generating vibration of at least one piezoelectric cantilever that is attached to said energy harvesting buoy in a position radiating outwardly away from a longitudinal axis of said buoy.

According to a fourth aspect of the invention, there is provided a method of harvesting electricity from transverse waves in a body of water, the method comprising collecting electrical power generated by at least piezeoelectric cantilever that is attached to an energy harvesting buoy in a water-exposed position radiating outwardly away from a longitudinal axis of the energy harvesting buoy at a submerged depth beneath a surface of said body of water.

According to another aspect of the invention, piezoelectric coupled cantilevers are attached to the buoy directly and located close to the ocean surface to absorb the transverse ocean wave energy. For an efficient energy harvesting, a smart design of the buoy structure in preferred embodiments is made of a slender cylindrical floater attached atop a large sinker to reduce the vibrational amplitude of the buoy and increase efficiency of the harvester.

BRIEF DESCRIPTION OF THE DRAWINGS

One embodiment of the invention will now be described in conjunction with the accompanying drawings in which:

FIG. 1A is a schematic side elevational view of an energy harvesting ocean buoy featuring piezoelectric cantilevers that are carried on the buoy at a short depth below the ocean surface to generate electrical power through vibration caused by relative displacement between ocean waves and the buoy in the transverse direction of the ocean waves.

FIG. 1B is a schematic top plan view of the energy harvesting ocean buoy of FIG. 1A with the piezoelectric cantilevers omitted.

FIG. 1C is a schematic top plan view of one of the piezoelectric cantilevers of the energy harvesting ocean buoy of FIG. 1A.

DETAILED DESCRIPTION

Apparatus

Figure 2:
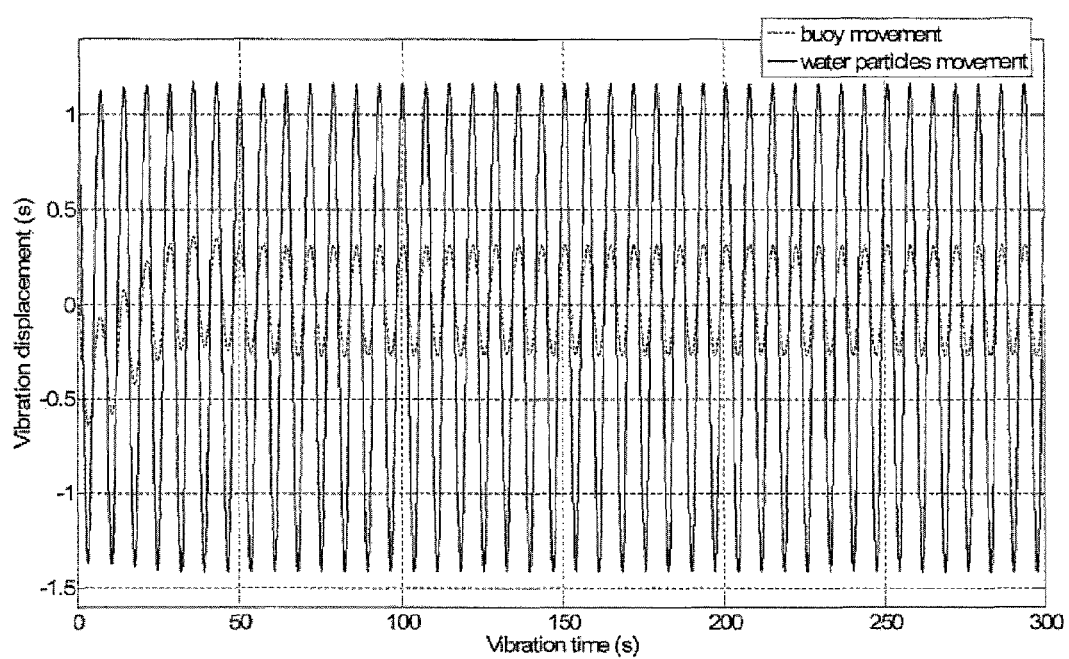
FIG. 2 is a graph showing displacement of ocean water particles and the energy harvesting ocean buoy at the ocean depth at which the cantilevers are carried based on a numerical model of the energy harvesting ocean buoy.

FIG. 1 illustrates schematically an energy harvesting buoy 10 that is attached by piezoelectric coupled cantilevers and is floating on the ocean surface 100. The structure is very expedient and easy to be installed and suspended in the intermediate and deep ocean for energy harvesting. The buoy consists of a slender floater 12 attached to a larger cylindrical sinker 14 to reduce the transverse vibration from the ocean to increase the efficiency of the harvester 10. Several piezoelectric coupled cantilevers 16 are fixed on the slender floater 12 close to the ocean surface 100. When a relative motion between the floating buoy 10 and the transverse ocean wave 102 is induced on the piezoelectric coupled cantilevers 16, the electric charge and voltage are generated on the surfaces of the piezoelectric patches 18 of the cantilevers.

From the side view of the buoy energy harvester 10 in FIG. 1A, it is seen that the axial length of the floater 12 of the buoy under the average ocean wave level is $Y_0$, the axial height of the buoy sinker fixed at the bottom of the floater is $Y_0'$, and the piezoelectric coupled cantilevers 16 with the length of L and thickness of h are fixed on the floater 12 of the buoy at a submerged depth close to the ocean surface in order to reach horizontally outward from the vertically oriented cylindrical floater 12. The distance between the piezoelectric coupled cantilevers 16 and the ocean surface 100 is $Y_1$. H is the wave height. $D_0$ and $D_1$ are the cross sectional areas of the floater 12 and the sinker 14 of the buoy 10, respectively, b is the width of the cantilevers 16 and the piezoelectric patches 18, and a is the length of the piezoelectric patches 18, which have A thickness of $h_1$ and are shown in the top view of FIG. 1C of the buoy. The vibrations of the floating buoy and the piezoelectric coupled cantilevers subjected to the transverse ocean waves are solved by the numerical models given as below.

FIG. 1 shows the central longitudinal axis A of the floater 12 oriented vertically, thus lying perpendicular to the ocean surface 102 in calm conditions free of any surfaces waves. Since the ocean waves propagate horizontally, the transverse displacement direction of the ocean waves is in the vertical direction. The longitudinal axis A of the floater 12 thus lies in the transverse direction of the waves. The sinker 14 is of greater diameter than the floater 12, and is fixed to a bottom end thereof in a concentric position therewith.

In one preferred embodiment, the buoy is designed as a hollow structure, whose mass and density can be changed by adjusting the a quantity or quality of a filler or ballast material contained within the hollow interior, in order to keep the buoy floating at a certain position of equilibrium in the water, when calm. For this purpose, the hollow buoy has at least one openable/closable port that communicates its hollow interior with the external environment to allow introduction and removal of filler or ballast to and from the hollow interior space of the buoy. The entire buoy may be hollow throughout, without any subdivision of its interior space, whereby a hollow cylindrical interior of the float fluidly communicates with a hollow cylindrical interior of the sinker.

In the illustrated embodiment, in which the sinker has a notably greater diameter than the floater, but is made with the same material and wall thickness as the floater, then the linear mass density of the sinker, along the longitudinal axis A, is greater than that of the floater when the interior spaces are occupied by the same filler. That is, even when both the floater and the sinker are occupied by a same filler material having uniform density throughout, the sinker provides a concentration of mass at the bottom end of the float because the cross-sectional area occupied by the filler and walls of the sinker is much, much greater than that of the floater. Accordingly, center of mass of the buoy is situated much nearer to the sinker end of the buoy than to the free distal end 12a of the floater situated opposite the sinker. This operates to maintain an upright orientation of the buoy when floating in the ocean, as the sinker end will always tend to sink relative to the opposing free end 12a of the floater 12. Accordingly, the distal end 12a of the floater defines a top end of the buoy that resides above the ocean surface, while the sinker 14 defines a bottom end of the buoy that resides at a submerged depth below the ocean surface.

The cantilevers 16 radiate outwardly from the floater 12 at a distance spaced downwardly from the free distal end 12a of the floater. The buoyancy of the buoy and the position of the cantilevers along the longitudinal axis A are selected so that the cantilevers 16 are submerged a short distance beneath the ocean surface 100 when the buoy is placed in calm ocean waters. The exterior location of the cantilevers outside the floater 12 places them in exposed condition to the surrounding ocean water. If the buoyancy is too great when the buoy interior is entirely empty (i.e. if the cantilevers 16 are found reside above the ocean surface when the hollow interior of the buoy is occupied only by air), then a liquid or granular filler or ballast material is added to the hollow buoy in order to increase the mass thereof without changing its shape, thus increasing the density of the buoy and thereby reducing its buoyancy. The one or more openable/closable ports of the hollow buoy preferably communicate with a hollow interior space of the sinker 14 so that added filler or ballast will accumulate therein so that the added mass, at least initially, accumulates at the sinker in order to contribute to a lowest-possible location of the buoy's center of mass along the longitudinal axis A.

The transverse ocean waves cause displacement of the water particles in a transverse direction relative to the propagation direction of the wave, i.e. displacing the water particles in a vertical direction relative to the wave's horizontal travel along the ocean surface 100. This movement of the water in turn causes displacement of the buoy in this same transverse direction, but the displacement of the buoy in this transverse direction is smaller in amplitude than that of the ocean wave. The illustrated configuration of the buoy, with a significant concentration of mass situated low on the upright longitudinal axis A of the buoy 10 at a bottom end sinker of greater diameter than the floater contributes to minimization of the transverse displacement experienced by the buoy, thereby increasing the amount of relative transverse displacement taking place between the buoy and the ocean wave.

It is known that ocean waves feature greater water particle displacement in the transverse direction at the ocean surface than at sub-surface depths therebelow. That is, the amplitude of the water particle displacement of an ocean wave decreases as ocean depth increases. By configuring the floater 12 with a smaller diameter relative to the sinker, the upper portion of the buoy that rises up from the ocean into the overlying air has a circumferential wall of lesser surface area for the transversely moving water particles to act on at the ocean surface where the water particle displacement is greatest. This narrow configuration of the floater thus contributes to reduction of the absolute transverse displacement experienced by the buoy under the action of the ocean waves. The larger diameter sinker at the bottom end is located at a more significant depth from the ocean surface, and thus contributes to the self-righting action of the buoy that tends to maintain the buoy's upright orientation due to the significant concentration of its mass at its lower end, while also minimizing the contributing effect of the sinker's greater surface area to the absolute transverse displacement of the buoy, as the larger-diameter sinker is located at a depth where the water particle displacement is of much lower amplitude than that experienced at the ocean surface.

The transverse displacement (i.e. rise and fall) of the buoy repeats on a periodic basis matching the frequency of the ocean wave, and due to the relative transverse displacement between the water and the buoy during propagation of the ocean wave, each cantilever experiences a bending vibration due to this interaction between the wave and the buoy. In a known manner, piezoelectric material on each cantilever is arranged to generate electrical power from such vibrational bending movement of the cantilever, for example by coupling of at least one, and preferably a series, of piezoelectric patches on the top face of the cantilever beam.

The cantilevers 16 extending radially away from the longitudinal axis A at the exterior of the floater 12 are preferably positioned at evenly spaced positions around the longitudinal axis A, and may be provided in an even number among which they are arranged in opposing pairs across the longitudinal axis. Like the preferably cylindrical shapes of the floater 12 and the sinker 14, this contributes to a balanced distribution of mass around the longitudinal axis in cross-sectional planes perpendicular thereto in order to aid in retention of the buoy's upright position.

While some embodiments feature a hollow float and hollow sinker to allow introduction and removal of filler or ballast, other embodiments may omit such adjustability, and instead have a set mass and density of the buoy that has been selected to provide the suitable buoyancy for proper positioning of the cantilevers in submerged positions. For example, one possible embodiment may employ a solid sinker 14 of greater material density than the float to provide the concentrated mass at the bottom end of the buoy, in which case the diameter of the sinker may or may not exceed the diameter of the float. Where the sinker does feature a hollow shell like the illustrated embodiment, but is permanently enclosed by the manufacturer and does not permit user-introduction and removal of filler or ballast, its interior space may be air-filled, or may contain a medium other than air. This may also be true of the float, which for example may be an enclosed hollow unit containing only air, or for example containing foam or some other content that does not detriment the overall buoyancy required to keep the buoy afloat.

Although the illustrated embodiment positions the cantilevers notably closer to the top end 12a of the float 12 than the bottom, which is may preferable in order to place them near the ocean surface where the transverse displacement of the water is greatest in order to maximize the relative displacement between the water and buoy and thereby achieve the greatest cantilever vibration and power output, other functional embodiments may still generate electrical power from the transverse ocean waves even with the cantilevers situated further down the buoy's longitudinal axis at a greater depth from the ocean surface.

Numerical Model

A numerical model has been developed to examine the efficiency of the new, expedient buoy with attached piezoelectric coupled cantilevers to absorb the energy from ocean waves.

The displacement function of transverse wave at the depth of the ocean, y, is given as below:

$$w_o(y,t) = H/2 * \cos(\omega_o t) * \frac{sh(k*(y+Od))}{sh(k*Od)}, \quad (1)$$

where $\omega_o$ is the angular frequency of the ocean wave, Od is the ocean depth, and k is the wave number. k is given as $k=2\pi/Ol$, where Ol is the ocean wave length, and $\omega_o$ can be calculated by:

$$\omega_o = \frac{2\pi}{\sqrt{2\pi * Ol/[g\tanh(k*Od)]}}.$$

To solve the transverse wave forces applied to the piezoelectric cantilevers, the relative motion between the ocean wave and the floating buoy should be obtained first by finding the exact movement/displacement of the floating buoy on the transverse direction in the ocean.

The total wave force applied to the buoy subjected to the transverse ocean wave can be expressed as below:

$$F(t) = F_{float}(t) + F_{ac1}(t) + F_{dr1}(t) + F_{ac2}(t) + F_{dr2}(t) \quad (2)$$

where $F_{float}(t)$ is the buoyant force variation applied to the buoy due to the wave motion; $F_{ac1}(t)$ and $F_{dr1}(t)$ are the initiate force and drag force caused by the water particles passing the buoy, respectively; and $F_{ac2}(t)$ and $F_{dr2}(t)$ are the initiate force and drag force caused by the water particles passing the piezoelectric cantilevers. The calculation of the buoyant force, initiate forces and drag forces applied to the buoy are listed as below:

$$F_{float}(t) = (H/2\cos\omega_o t - w(t))D_0\rho g, \quad (3)$$

$$F_{ac1}(t) = \int_{-Y}^{0}\left(\frac{\partial^2 w_o(y,t)}{\partial t^2}\right)dy D_0\rho(1+C_m) - \int_{-Y}^{0}\frac{d^2 w(t)}{dt^2}dy D_0\rho C_m + \quad (4)$$
$$\int_{-Y'}^{-Y}\left(\frac{\partial^2 w_o(y,t)}{\partial t^2}\right)dy D_1\rho(1+C_m) - \int_{-Y'}^{-Y}\frac{d^2 w(t)}{dt^2}dy D_1\rho C_m,$$

where w(t) is the displacement function of the floating buoy in the transverse direction; $\rho$ is the density of the ocean water and is given as 1025 kg/m^3; Cm is the coefficients of the inertia forces of the added mass when the water particles pass through the buoy; Y and Y' are the distances from the ocean surface to the bottom of the floater and the sinker, respectively, can be solved by:

$$\begin{cases} Y = (H/2*\cos\omega_o t - w(t)) + Y_0 \\ Y' = (H/2*\cos\omega_o t - w(t)) + Y_0 + Y_0' \end{cases} \cdot F_{dr1}(t) = \quad (5)$$
$$C_D * \rho * D_1\left(\frac{dw_o(-Y',t)}{dt} - \frac{dw(t)}{dt}\right)\left|\frac{dw_o(-Y',t)}{dt} - \frac{dw(t)}{dt}\right|\Big/2,$$

$$F_{ac2}(t) = \left(\frac{d^2 w_o(-Y_L,t)}{dt^2}\right)Lbh(1+C_m) - \frac{d^2 w(t)}{dt^2}LbhC_m, \quad (6)$$

where $Y_L$ is solved by, $Y_L=(H/2*\cos \omega_o t-w(t))+Y_1$; $C_D$ is the coefficient of the drag force, and $$F_{dr2}(t) = NC_d\rho Lb\left(\frac{dw_o(-Y_L,t)}{dt} - \frac{dw(t)}{dt}\right)\left|\frac{dw_o(-Y_L,t)}{dt} - \frac{dw(t)}{dt}\right|\bigg/2, \quad (7)$$

where N is the number of the piezoelectric coupled cantilevers attached on the buoy harvester.

Based on Newton's second law, we can get the relationship between the buoy motion and the total wave force applied to the buoy as below, $$M_B\frac{d^2w(t)}{dt^2} = F(t) \quad (8)$$

where $M_B$ is the total mass of the buoy, $M_B=(D_0Y_0'+D_1Y_0'+Nbhl)*\rho$. To obtain the displacement of the floating buoy, $w(t)$, we need to solve the complex non-homogeneous differential equations, given in Equations (2)-(8) above, and the solving process is quite complicated. Thus, a numerical iterative algorithm was developed to solve the accurate dynamic displacement of the buoy under the ocean waves in the time period from 0 to T after the buoy is initially located in the ocean.

First, a very short time step, $\Delta t$, is chosen to process the iterative algorithm. The initial condition is assumed with:

$$\frac{d^2w(t)}{dt^2} = 0, \frac{dw(t)}{dt} = 0, w(t) = 0, w_0(0,t) = H/2*\cos\omega t \text{ at } t = 0s.$$

Based on the assumption, the total wave force applied to the buoy at $t=0$ s, $F(t=0)$, can be solved. With the force, $F(t=0)$, the acceleration, velocity and displacement of the buoy at the first time step, $$\frac{d^2w(t=1*\Delta t)}{dt^2}, \frac{dw(t=1*\Delta t)}{dt}, w(t=1*\Delta t),$$

can be solved by Eq. (8). Accordingly, the acceleration, velocity and displacement of the buoy at the time of $$j*\Delta t = T, \frac{d^2w(t=j*\Delta t=T)}{dt^2},$$

$$\frac{dw(t=j*\Delta t=T)}{dt}, w(t=j*\Delta t=T); j \geq 2,$$

can be obtained.

Then, the relative displacement between the ocean wave and the piezoelectric cantilevers attached on the buoy at any time between 0 to T can be solved as below, $$w_{onb}(i*\Delta t)=H/2*w_o(-Y_L(i*\Delta t),t)-w(i*\Delta t), \quad (9)$$

where $0 \leq i \leq j$.

At last, after the fitting of the discrete data curve of $w(i*\Delta t)$, the solution of the relative displacement between the ocean wave and the piezoelectric cantilevers attached on the floating buoy, $w_{onb}(t)$, can be obtained. And then, the transverse wave pressure applied to a single cantilever can be expressed as, $$P(t) = \frac{1}{2}C_D\rho b \cdot \frac{dw_{onb}(t)}{dt}\left|\frac{dw_{onb}(t)}{dt}\right| + \quad (10)$$

$$(1+C_m)\rho bh\frac{d^2w_{onb}(t)}{dt^2} - C_m\rho bh\frac{\partial^2 w_b(x,t)}{\partial t^2},$$

where $w_b(x,t)$ is the displacement of the piezoelectric coupled cantilever subjected to the wave force. The effect of the piezoelectric patches on the dynamic response of the cantilevers is ignored herein, since the thickness of piezoelectric patches is very small compared with that of the host beam. According to the Euler-Bernoulli beam theory, the governing equation of the piezoelectric coupled cantilever is hence expressed as:

$$EI\frac{\partial^4 w_b(x,t)}{\partial x^4} + (c_m\rho bh + \rho_1 hb)\frac{\partial^2 w_b(x,t)}{\partial t^2} = \quad (11)$$

$$\frac{1}{2}C_D\rho b \cdot \frac{dw_{onb}(t)}{dt}\left|\frac{dw_{onb}(t)}{dt}\right| + (1+C_m)\rho bh\frac{d^2 w_{onb}(t)}{dt^2},$$

where $\rho_1$ and EI are the material density and flexural rigidity of the cantilever substrate, respectively.

It is assumed that the piezoelectric patches are mounted tightly on the surface of the cantilever. Due to the bending motion of the cantilever, the two faces of the beam exhibit positive and negative axial strains alternatively. As a result, the generated charge $Q_g^i$ and voltage $V_g^i$ on the surface of the ith piezoelectric patch is hence provided as [26]:

$$Q_g^i(t) = -\frac{e_{31}b(h+h_1)}{2}*\left(\frac{\partial w_b(x,t)}{\partial x}\bigg|_{x=ia} - \frac{\partial w_b(x,t)}{\partial x}\bigg|_{x=(i-1)a}\right), \quad (12)$$

$$V_g^i(t) = -\frac{e_{31}(h+h_1)}{2C_V'}*\left(\frac{\partial w_b(x,t)}{\partial x}\bigg|_{x=ia} - \frac{\partial w_b(x,t)}{\partial x}\bigg|_{x=(i-1)a}\right), \quad (13)$$

where $e_{31}$ is the piezoelectric constant; Cv is the electrical capacity of the piezoelectric patches; and C'v is the electrical capacity per unit width of the piezoelectric patches (C'v=Cv/b).

To obtain the displacement field of the forced vibration of the piezoelectric harvester, $w_b(x,t)$, in Eq. (11), the free vibration of the harvester should be solved first by getting its resonant frequencies corresponding with different vibration modes. First, the vibration modes of the free vibration solution of the cantilever can be obtained:

$$W(x)=C_1 \cos hsx+C_2 \sin hsx+C_3 \cos sx+C_4 \sin sx \quad 0 \leq x \leq l \quad (14)$$

where $C_1, C_2, \ldots, C_4$ are the corresponding unknown coefficients, and s is given as $$s = \sqrt[4]{\frac{(C_m\rho bh + \rho_1 hb)\omega^2}{EI}}, \quad (15)$$

and $\omega$ is the angular frequency of the cantilever.

Substituting Eq. (14) into boundary conditions of the cantilever leads to four linear equations, from which we can easily obtain the solution of the nth normal mode of the cantilever, $W_n(x)$.

The forced vibration of the piezoelectric coupled cantilever subjected to the transverse wave pressure can thus be provided as follow:

$$w_b(x, t) = \sum_{n=1}^{\infty} W_n(x) \cdot \frac{\int_0^l W_n(x)dx}{\rho b h \omega_n B_n} \int_0^t P(\tau)\sin\omega_n(t-\tau)d\tau, \quad (16)$$

where $B_n$ is given as $B_n = \int_0^l W_n^2(x)dx$. The integration in Eq. (16) can be solved by a discrete numerical algorithm, $$\int_0^t P(\tau)\sin\omega_n(t-\tau)d\tau = \sum_{i=0}^{t/\Delta\tau} P(i*\Delta\tau)\sin\omega_n(t - i*\Delta\tau)\Delta\tau.$$

$\Delta\tau$ is a very short time step, and for each time step, the value of the term, $$\frac{dw_{onb}(t)}{dt},$$

will be determined to find the exact value of the wave pressure applied to the piezoelectric harvester, $P(i*\Delta\tau)$.

Then, by substituting Equation (16) into Equations (12) and (13), the generated charge $Q_g^i(t)$ and voltage $V_g^i(t)$ from the ith piezoelectric patch bonded on the piezoelectric energy harvester subjected to transverse wave pressure at time t can be solved:

$$Q_g^i(t) = -\frac{e_{31}b(h+h_1)}{2} \sum_{n=1}^{\infty}\left(\frac{dW_n(x)}{dx}\bigg|_{x=ia} - \frac{dW_n(x)}{dx}\bigg|_{x=(i-1)a}\right) \quad (17)$$

$$\frac{\int_0^l W_n(x)dx}{\rho b h \omega_n B_n} \int_0^t P(\tau)\sin\omega_n(t-\tau)d\tau,$$

$$V_g^i(t) = -\frac{e_{31}(h+h_1)}{2C_V'} \sum_{n=1}^{\infty}\left(\frac{dW_n(x)}{dx}\bigg|_{x=ia} - \frac{dW_n(x)}{dx}\bigg|_{x=(i-1)a}\right) \quad (18)$$

$$\frac{\int_0^l W_n(x)dx}{\rho b h \omega_n B_n} \int_0^t P(\tau)\sin\omega_n(t-\tau)d\tau,$$

where $1 \leq i \leq m$, and m is the number of the piezoelectric patches mounted on one face of one of cantilever harvesters.

Finally, the expression of the root mean square (RMS) of the total generated electric power can be solved. When the transverse wave oscillates for a period of T, the RMS of the generated electric power from time 0 to T is given as:

$$p_e^{rms} = \sqrt{\frac{1}{T}\int_0^T [p_e(t)]^2 dt}, \quad (19)$$

where $p_e(t)$ is the total electric power generated by all piezoelectric patches on the cantilever harvesters, which are attached on the buoy, at time t (0<t<T) and it is given by $$p_e(t) = 2N \sum_{i=1}^{m} \frac{dQ_g^i(t)}{dt} V_g^i(t).$$

Simulations and Discussions

Based on the developed numerical model, the generated charge and voltage from the piezoelectric patches as well as the RMS of the electric power generated by the buoy energy harvester can be obtained. To find a better design of the buoy structure with higher generated electric power, the effects of dimensions of the buoy floater and sinker on the RMS were investigated by numerical simulations. In these simulations, the height and length of the ocean wave and the ocean depth are H=3 m, Ol=80 m and Od=40 m for the waves in the intermediate and deep ocean. The frequency of the ocean wave can be solved by the description given after Equation (1) as 0.16 Hz. In this example, there are four aluminum piezoelectric cantilevers attached on the buoy and fixed at 2 m ($Y_1$=2 m) below the average ocean wave level. The materials properties and the fixed dimensions of the cantilever and the piezoelectric patches are given in Table 1 as follows.

TABLE 1

Material properties of the piezoelectric coupled cantilever.

| Parameters | Host beam (Aluminum) | Piezoelectric patches (PZT4) |
|---|---|---|
| Length, l/a (m) | 1 | 0.05 |
| Width, b (m) | 0.2 | 0.2 |
| Thickness, h/$h_1$ (m) | 0.006 | 0.0006 |
| Young's modulus (N/m$^2$) | 78e9 | 7.5e10 |
| Mass density (kg/m$^3$) | 2800 | 7500 |
| $e_{31}$ (C/m$^2$) | | −2.8 |
| $C_v$ (nF) | | 0.375 for the piezoelectric patch with the geometry of 0.01 m, 0.01 m, 0.0001 m |

FIG. 2 provides the transverse vibration displacements of the water particles, at the position where the cantilevers are located, and the buoy versus time. The dimensions of the buoy and the piezoelectric patches in the numerical simulation are set to be $Y_0$=10 m, $Y_0'$=2 m, $D_1$=0.04 m^2 and $D_0$=9 m^2. It is seen that the transverse displacement of ocean wave at the position, where cantilevers are located, changes from −1.4 m to 1.2 m with the ocean wave height of 3 m given in FIG. 1. The vibration of the buoy is in its un-steady state with variable vibration amplitudes in the first 50 s after the buoy is initially located in the ocean. Then the vibration amplitude of the buoy becomes a steady value of 0.32 m, and the frequency of the buoy vibration matches the frequency of the ocean wave motion. In addition, it is noted that the amplitude of the steady state vibration of the buoy is much lower than the one of water particles so that the large relative transverse displacement between the ocean wave and the buoy can be obtained for the efficient energy harvesting. In simulations, only steady state vibration of the buoy is considered in order to calculate the RMS of the generated electric power.

Figure 3:
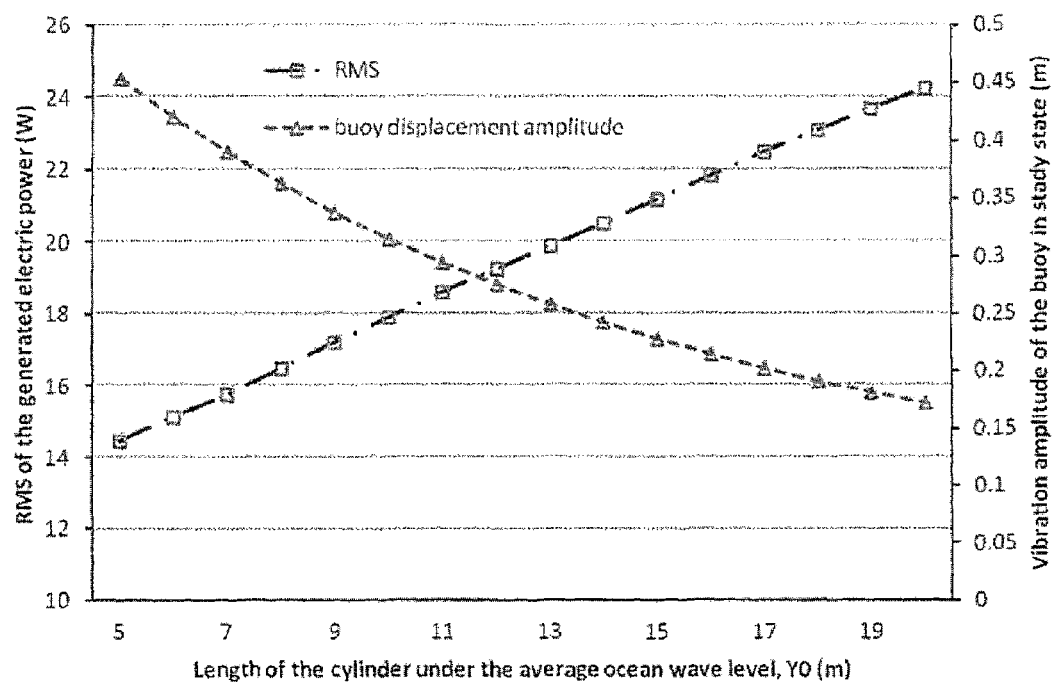
FIG. 3 is a graph generated from output of the numerical model to show variation of the steady state vibration amplitude and the generated electric power plotted against varying axial lengths of a cylindrical floater of the buoy of FIG. 1A, from which the cantilevers extend at height above a sinker that is attached to the lower end of the floater.

FIG. 3 illustrates the variations of the steady state vibration amplitude of the buoy and the RMS versus different lengths of the floater of the buoy under the average ocean wave level. The dimensions of the buoy are set as $Y_0'$=2 m, $D_0$=0.04 m^2 and $D_1$=9 m^2. In FIG. 2, it is found that the vibration amplitude is reduced significantly from 0.45 m to 0.16 m when the floater length changes from 5 m to 20 m. This phenomenon can be explained as follow. From Equation (1), it is seen that the amplitude of transverse displacement of the ocean wave decreases with an increase in the water depth. A longer floater of the buoy under the water leads to a deeper location of the sinker, where the ocean wave motion and drag force applied to the bottom of the buoy are smaller shown in Equation (5). Correspondingly, the vibration amplitude of the buoy will be smaller as well leading to larger ocean wave force applied to the piezoelectric coupled cantilever and higher generated electric power. It is seen from FIG. 3 that the RMS increases from 14.4 W to 24.3 W with the decrease of the vibration amplitude of the buoy from 0.45 m to 0.16 m when the length of the floater changes from 5 m to 20 m. It can be concluded that the more effective energy harvesting from the ocean wave motions can be realized by the buoy energy harvester with a longer floater structure.

Figure 4:
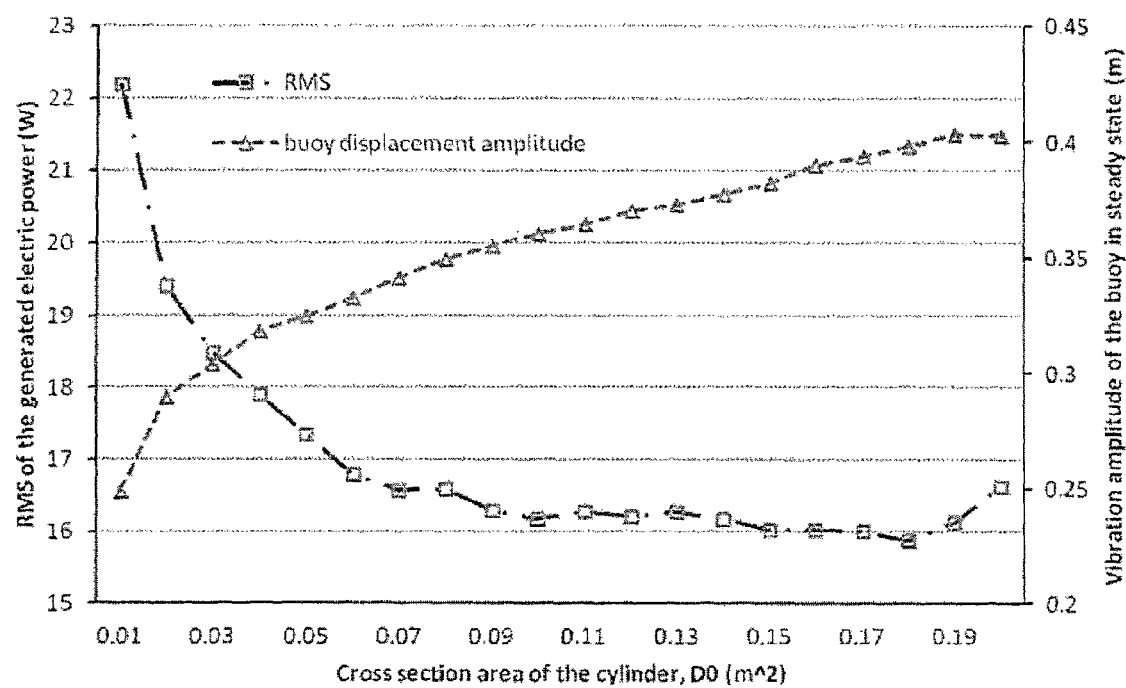
FIG. 4 is a graph showing variation of the steady state vibration amplitude and the generated electric power based plotted against varying diameters of the sinker.

FIG. 4 provides the values of the steady state vibration amplitude of the buoy and the RMS corresponding to different cross section areas of the floater of the buoy with the dimension of the buoy and the piezoelectric patches to be $Y_0=10$ m, $Y_0'=2$ m and $D_1=9$ m^2. It is found that the vibration amplitude of the buoy increase from 0.25 m to 0.4 m nonlinearly with the increase in the cross section area of the floater of the buoy from 0.01 m^2 to 0.2 m^2. This phenomenon is the result of the coupling effect of the increase in the buoyant force variation and the initiate forces applied to the buoy and the increase in the total mass of the buoy corresponding to the increase in the cross section area of the floater. As discussed before, with the increase in the vibration amplitude of the buoy, the amplitude of the relative displacement between the ocean wave and the piezoelectric coupled cantilever will be reduced leading to a smaller ocean wave force on the cantilever and the lower electric energy generated by the piezoelectric patches. From FIG. 4, it is hence seen that the RMS decrease from 22.2 W to 16 W when the cross section area of the floater increase from 0.01 m^2 to 0.2 m^2. The buoy with a thinner floater structure can generate greater electrical power.

Figure 5:
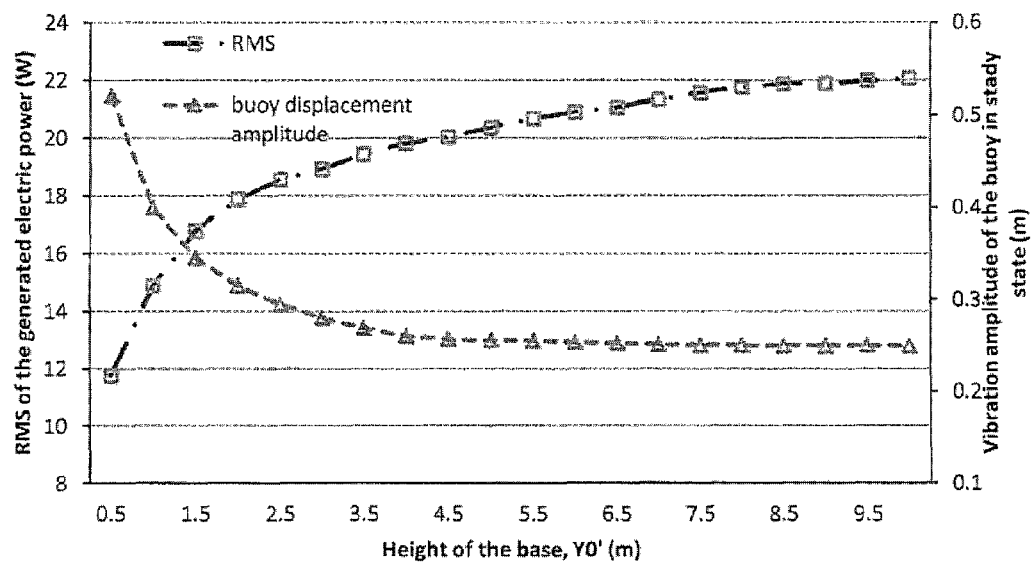
FIG. 5 is a graph showing variation of the steady state vibration amplitude and the generated electric power based plotted against varying axial lengths of the sinker.

FIG. 5 illustrates the effect of the height of the sinker of the buoy on the amplitude of displacement of the buoy and the RMS, with the dimension of the buoy and the piezoelectric patches as $Y_0=10$ m, $D_0=0.04$ m^2 and $D_1=9$ m^2. It is seen clearly that the displacement amplitude of the buoy decrease from 0.54 m to 0.24 m non-linearly with the increase in the height of the sinker of the buoy from 0.5 m to 10 m. Due to the increase in the height of the buoy sinker, the initiate force applied to the buoy will be enlarged, as shown in Equation (4), but the increase is not obvious since the ocean wave motion at the buoy sinker in the deep water is weak with respect to the one at the ocean surface. On the other hand, the mass of the buoy is increased significantly with the increase in the height of the buoy sinker leading to the smaller acceleration of the buoy and the reduction of the amplitude of the displacement of the buoy. Corresponding to the decrease of the vibration amplitude of the buoy motion, the RMS increases from 11.8 W to 22 W non-linearly, when the height of the sinker of the buoy changes from 0.5 m to 10 m. From FIG. 5, it is also noted that the RMS increases more significantly for the height of the buoy sinker that changes from 0.5 m to 2.5 m. When the height of the buoy sinker is larger than 2.5 m, the increase in the generated electric power is not obvious. Thus, it can be concluded that the larger height of the sinker of the buoy harvester can lead to the more efficient energy harvesting, but further increasing of the height of the sinker structure above a certain value will not enhance the energy harvesting effectiveness significantly.

Figure 6:
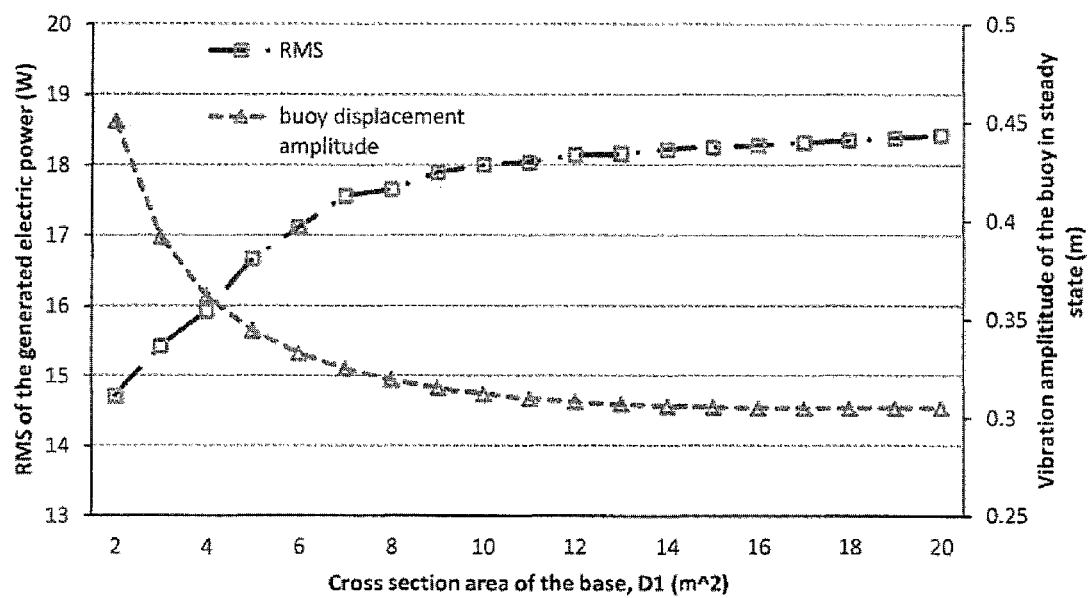
FIG. 6 is a graph showing variation of the steady state vibration amplitude and the generated electric power based plotted against varying cross sectional areas of the sinker.

The variations of the amplitude of the displacement of the buoy and the RMS versus different cross section areas of the buoy sinker are shown in FIG. 6. The dimensions of the buoy and piezoelectric patches are given as $Y_0=10$ m, $Y_0'=2$ m and $D_0=0.04$ m^2. Similar with the results showed in FIG. 5, the amplitude of the buoy displacement decreases non-linearly from 0.45 m to 0.31 m corresponding to the increase in the cross section area of the buoy sinker from 2 m^2 to 20 m^2. Although the drag force from the ocean wave motion applied to the buoy increases with the increase in the cross section area of the buoy sinker shown in Equation (5), the increase in the mass of the buoy is more significant leading to a smaller acceleration and the amplitude of the transverse displacement of the buoy. Correspondingly, the RMS will increase with the increase in the cross section of the buoy sinker. From FIG. 6, the RMS is found to increase significantly from 14.7 W to 17.6 W when the cross section area of the buoy sinker increases from 2 m^2 to 7 m^2. However, the enhancement of the energy generation from the buoy harvester is not quite obvious when the cross section area of the buoy is larger than 7 m^2. In summary, the increase in the cross section area of the sinker of the buoy harvester in a certain range will lead to a significant enhancement of the energy harvesting efficiency, but the effect is not very obvious when the cross section area of the sinker structure is above a certain value.

It is noted that numerical simulations summarized herein provide guidance on optimizing the design of the proposed buoy harvester attached with piezoelectric coupled cantilevers. Higher electric energy can be generated when longer piezoelectric cantilevers are attached on larger buoy structures subjected to stronger ocean waves. However, the specific dimensional values specified in the forgoing summary of the numerical simulations are presented as examples only, and are not intended to limit the scope of the present invention.

In summary of the forgoing disclosure, an expedient and economic buoy energy harvester with attached horizontal piezoelectric coupled cantilevers is developed for the energy harvesting from wave motions in the intermediate and deep ocean. A smart design of the buoy in preferred embodiments, which is composed by a slender floater and a large sinker structure, is presented to reduce the vibration amplitude of the transverse motion of the floating buoy subjected to the transverse ocean waves so that the larger wave force will be applied to the piezoelectric coupled cantilevers for more efficient energy harvesting. An accurate numerical model has been developed to calculate the vibrations of the buoy and the piezoelectric coupled cantilevers subjected to the transverse ocean waves as well as the generated electric energy for the first time. From numerical simulations, it is concluded that higher electric power can be generated by the buoy harvester with a longer and thinner floater and a larger sinker.

For example, an electric power of 24 W can be generated by a single piezoelectric buoy harvester with the dimensions of $Y_0=20$ m, $Y_0'=2$ m, $D_0=0.04$ m^2, $D_1=9$ m^2, $Y_1=2$ m, l=1 m, b=0.2 m, h=0.006 m, $h_1=0.0006$ m and a=0.05 m for the ocean wave with the wave height, wave length and ocean depth of H=3 m, Ol=80 m and Od=40 m, respectively. This electric power is sufficient to power small electrical appliances, such as high power LEDs and wireless signal access points. For practical applications, the energy harvesting effectiveness and the generated electric power can be further improved by using larger buoys and longer cantilevers subjected to stronger ocean waves. The technique proposed in this research can provide a expedient, feasible and stable energy supply from the floating buoy.

Since various modifications can be made in my invention as herein above described, and many apparently widely different embodiments of same made within the spirit and scope of the claims without department from such spirit and scope, it is intended that all matter contained in the accompanying specification shall be interpreted as illustrative only and not in a limiting sense.

REFERENCES

[1] Y. C. Shu, I. C. Lien, Analysis of power output for piezoelectric energy harvesting systems, Smart Mater. Struct. 15 (2006) 1499-512.
[2] S. P. Beeby, M. J. Tudor, N. M. White, Energy harvesting vibration sources for microsystems applications, Measurement Science and Technology 17 (2006) 175-195.
[3] A. Erturk, D. J. Inman, A distributed parameter electromechanical model for cantilevered piezoelectric energy harvesters, Journal of Vibrations and Acoustics 130 (2008) 041002.
[4] C. B. Williams, R. B. Yates, Analysis of a micro-electric generator for Microsystems, Sensors Actuators A 52 (1996) 8-11.
[5] S. Priya, Advances in energy harvesting using low profile piezoelectric transducers, J. Electroceram. 19 (2007) 165-182.
[6] Q. Wang, S. T. Quek, A model for the analysis of beam embedded with piezoelectric layers, Journal of Intelligent Systems and Structures 13 (2002) 61-70.
[7] Q. Wang, S. T. Quek, C. T. Sun, X. Liu, Analysis of Piezoelectric Coupled Circular Plate, Smart Materials and Structures 10 (2001) 229-239.
[8] W. H. Duan, S. T. Quek, Q. Wang, Free Vibration Analysis of Piezoelectric Coupled Thin And Thick Annular Plate, Journal of Sound and Vibration 281 (2005) 119-139.
[9] J. Ajitsaria, S. Y. Choe, D. Shen, D. J. Kim, Modeling and analysis of a bimorph piezoelectric cantilever beam for voltage generation, Smart Mater. Struct. 16 (2007) 447-454.
[10] J. G. Rocha, L. M. Gonçalves, P. F. Rocha, M. P. Silva, S. Lanceros-Méndez, Energy harvesting from piezoelectric materials fully integrated in footwear, IEEE Transactions on Industrial Electronics 57 (2010) 813-819.
[11] A. A. Waleed, H. Matthias, H. Tobias, S. Walter, Frequency tuning of piezoelectric energy harvesters by magnetic force, Smart Mater. Struct. 21 (2012) 035019.
[12] Y. Liao, H. A. Sodano, Model of a single mode energy harvester and properties for optimal power generation, Smart Mater. Struct. 17 (2008) 065026.
[13] Q. Wang, C. M. Wang, Optimal placement and size of piezoelectric patches on beams from the controllability perspective, Smart Materials and Structures 9 (2000) 558-567.
[14] Q. Wang, N. Wu, Optimal design of piezoelectric coupled beam for power harvesting, Smart Mater. Struct. 21 (2012) 085013.
[15] X. D. Xie, N. Wu, K. V. Yuen, Q. Wang, Energy harvesting from high-rise buildings by a piezoelectric coupled cantilever with a proof mass, International Journal of Engineering Science 72 (2013) 98-106.
[16] S. R. Anton, H. A. Sodano, A review of power harvesting using piezoelectric materials (2003)-(2006), Smart Materials and Structures 16 (2007) R1-R21.
[17] V. J. Ovejas, A. Cuadras, Multimodal piezoelectric wind energy harvesters, Smart Mater. Struct. 20 (2011) 085030.
[18] S. Li, J. Yuan, H. Lipson, Ambient wind energy harvesting using cross-flow fluttering, Journal of Applied Physics 109 (2011) 026104.
[19] X. T. Gao, W. H. Shih, W. Y. Shih, Flow energy harvesting using piezoelectric cantilevers with cylindrical extension, IEEE Transactions On Industrial Electronics 60 (2013) 1116-1118.
[20] N. Wu, Q. Wang, X. D. Xie, Wind energy harvesting with a piezoelectric harvester. Smart Mater. Struct. 22 (2013) 095023.
[21] R. Murray, J. Rastegar, Novel two-stage piezoelectric-based ocean wave energy harvesters for moored or unmoored buoys, Active and Passive Smart Structures and Integrated Systems Proc. of SPIE 7288 (2009) 1117-1129.
[22] G. W. Taylor, J. R. Burns, S. M. Kammann, W. B. Powers, T. R. Welsh, The energy harvesting eel: a small subsurface ocean/river power generator, IEEE Journal of Oceanic Engineering 26 (2001) 539-547.
[23] A. S. Zurkinden, F. Campanile, L. Martinelli, Wave energy converter through piezoelectric polymers, Proceedings of the COMSOL Users Conference, Boston Marriott Newton, Oct. 4-6, 2007.
[24] X. D. Xie, Q. Wang, N. Wu Energy harvesting from sea waves by a piezoelectric harvester, Journal of Sound and Vibration 2013 Under review.
[25] J. R. Burns, Ocean wave energy conversion using piezoelectric material members, US: 4685206. (1987).
[26] C. K. Lee, F. C. Moon, Modal sensors and actuators, J. Appl. Mech. 57 (1990) 434-441.

The invention claimed is:

1. A wave energy harvester for generating electricity from transverse waves in a body of water, said wave energy harvester comprising a buoy that comprises a float and at least one cantilevered member attached to the float and radiating outwardly away from a longitudinal axis of said float in a position located externally of said float for exposure of said cantilevered member to surrounding water under placement of the buoy in said body of water, the at least one cantilevered member having piezoelectric material thereon arranged to generated electrical power under vibration of said at least one cantilevered member, wherein the float has an elongated axial dimension measured along the longitudinal axis between upper and lower ends of the float, the upper end of the float defining an upper end of the buoy and the buoy having a center of mass located nearer to said lower end of the float than to said upper end of the float, and the at least one cantilevered member is spaced a distance from said upper end of the float along the longitudinal axis thereof in order to reside in a submerged position below a surface of the body of water.

2. The wave energy harvester of claim 1 wherein the buoy is free floating buoy.

3. The wave energy harvester of claim 1 wherein the at least one cantilevered member is positioned between said center of mass and said upper end of the float.

4. The wave energy harvester of claim 1 wherein the position of the at least one cantilevered member is nearer to the upper end of the float than the lower end thereof.

5. The wave energy harvester of claim 1 wherein the buoy comprises a sinker portion that is attached to the lower end of the float and which, along the longitudinal axis, has a greater linear mass density than the float.

6. The wave energy harvester of claim 5 wherein the sinker portion has a greater diameter across the longitudinal axis than the float.

7. The wave energy harvester of claim 5 wherein the sinker portion has an axial length, measured along the longitudinal axis, which is less than the axial dimension of the float.

8. The wave energy harvester of claim 5 wherein the float and the sinker comprises respective bodies of a same material.

9. The wave energy harvester of claim 5 wherein the sinker is cylindrical.

10. The wave energy harvester of claim 1 wherein the float is cylindrical.

11. The wave energy harvester of claim 1 wherein the buoy comprises a hollow interior and at least one selectively openable and closeable opening by which a fill medium can be selectively introduced and removed to change an average density of the buoy.

12. The wave energy harvester of claim 1 wherein the at least one cantilevered member comprises a plurality of cantilevered members evenly spaced apart around the longitudinal axis.

13. The wave energy harvester of claim 12 wherein the plurality of cantilevered members are even in number and arranged in opposing pairs across the longitudinal axis.

14. A method of generating electricity from transverse waves in a body of water, the method comprising, with the buoy of the wave energy harvester of claim 1 floating in said body of water with the at least one cantilevered member submerged below the surface of said body of water, using relative displacement between said transverse waves and said buoy to cause electricity-generating vibration of the at least one cantilevered member of said wave energy harvester.

15. The method of claim 14 comprising first placing the buoy in the body of water in a free-floating, unmoored, unanchored condition.

16. The method of claim 14 comprising first placing the energy harvesting buoy in the body of water in a self-righting condition tending to maintain an upright orientation of the longitudinal axis of the energy harvesting buoy.

17. A method of harvesting electricity from transverse waves in a body of water, the method comprising, with the buoy of the wave energy harvester of claim 1 floating in said body of water with the at least one cantilevered member submerged below the surface of said body of water, collecting electrical power generated by the piezoelectric material on the at least one cantilevered member.

* * * * *